(12) United States Patent
Takeuchi et al.

(10) Patent No.: US 9,713,293 B2
(45) Date of Patent: Jul. 18, 2017

(54) ELECTRIC POWER CONVERTER

(71) Applicant: DENSO CORPORATION, Kariya, Aichi-pref. (JP)

(72) Inventors: Kazuya Takeuchi, Kariya (JP); Makoto Okamura, Kariya (JP); Yuuichi Handa, Kariya (JP); Naoki Hirasawa, Kariya (JP); Hiromi Ichijo, Kariya (JP); Ryota Tanabe, Kariya (JP); Tetsuya Matsuoka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/919,161

(22) Filed: Oct. 21, 2015

(65) Prior Publication Data

US 2016/0157381 A1    Jun. 2, 2016

(30) Foreign Application Priority Data

Oct. 21, 2014   (JP) .................................. 2014-214599

(51) Int. Cl.
| | |
|---|---|
| H05K 7/20 | (2006.01) |
| H01L 23/473 | (2006.01) |
| H01G 4/35 | (2006.01) |
| H01G 4/40 | (2006.01) |
| H01G 2/08 | (2006.01) |
| H01G 4/236 | (2006.01) |
| H02M 7/00 | (2006.01) |
| H01L 23/40 | (2006.01) |

(52) U.S. Cl.
CPC ........... *H05K 7/20927* (2013.01); *H01G 2/08* (2013.01); *H01G 4/236* (2013.01); *H01G 4/35* (2013.01); *H01G 4/40* (2013.01); *H01L 23/473* (2013.01); *H01L 2023/4025* (2013.01); *H02M 7/003* (2013.01)

(58) Field of Classification Search
CPC ...... H05K 7/205; H05K 7/20; H05K 7/20927; H01L 23/473; H01L 2023/4025; H02M 7/003; H01G 15/00
USPC ........................................................ 361/709
See application file for complete search history.

(56) References Cited

U.S. PATENT DOCUMENTS

| | | | | |
|---|---|---|---|---|
| 4,015,173 A | * | 3/1977 | Nitsche ............... | H01L 23/4006 174/16.3 |
| 6,014,313 A | * | 1/2000 | Hesselbom ......... | H01L 25/0652 174/16.3 |

(Continued)

FOREIGN PATENT DOCUMENTS

| | | | |
|---|---|---|---|
| JP | 2002-083915 A | | 3/2002 |
| JP | 2014110400 A | * | 6/2014 |

*Primary Examiner* — Anatoly Vortman
(74) *Attorney, Agent, or Firm* — Oliff PLC

(57) ABSTRACT

An electric power converter includes a semiconductor module constituting a power conversion circuit, a capacitor electrically connected to the semiconductor module, and a cooling member for cooling the capacitor. The capacitor includes an element body provided with internal electrode, and a pair of end-face-electrodes provided on both end faces of the element body and connected to the internal electrode. The pair of end-face-electrodes are connected with a pair of bus bars, respectively, in a manner of surface contact. The capacitor is disposed in a state where one of the pair of end-face-electrodes is facing the cooling member. The end-face-electrode facing the cooling member is in contact with the cooling member via the bus bar.

8 Claims, 13 Drawing Sheets

(56) References Cited

U.S. PATENT DOCUMENTS

| | | | | |
|---|---|---|---|---|
| 6,542,365 | B2* | 4/2003 | Inoue | H01L 23/4006 |
| | | | | 165/80.4 |
| 7,200,007 | B2* | 4/2007 | Yasui | H02M 7/003 |
| | | | | 165/80.4 |
| 8,582,291 | B2* | 11/2013 | Nakasaka | H01L 23/4093 |
| | | | | 257/707 |
| 2001/0033477 | A1 | 10/2001 | Inoue et al. | |
| 2003/0090873 | A1* | 5/2003 | Ohkouchi | H01L 23/4006 |
| | | | | 361/704 |
| 2004/0144996 | A1 | 7/2004 | Inoue | |
| 2005/0040515 | A1 | 2/2005 | Inoue et al. | |
| 2006/0120047 | A1 | 6/2006 | Inoue | |
| 2006/0232939 | A1 | 10/2006 | Inoue | |
| 2007/0030624 | A1* | 2/2007 | Hosking | H01G 4/232 |
| | | | | 361/301.5 |
| 2010/0008019 | A1* | 1/2010 | Burn | C04B 35/465 |
| | | | | 361/321.4 |
| 2011/0261600 | A1* | 10/2011 | Tachibana | H02M 7/003 |
| | | | | 363/131 |
| 2013/0264891 | A1* | 10/2013 | Sawada | H02M 3/00 |
| | | | | 307/147 |
| 2014/0119087 | A1* | 5/2014 | Matsuoka | H02M 7/003 |
| | | | | 363/132 |
| 2014/0140034 | A1* | 5/2014 | Kusada | H05K 7/1432 |
| | | | | 361/820 |
| 2014/0153189 | A1* | 6/2014 | Okamura | H05K 1/0213 |
| | | | | 361/688 |
| 2014/0185266 | A1* | 7/2014 | Iwata | H02M 7/003 |
| | | | | 361/820 |
| 2014/0355221 | A1* | 12/2014 | Sawada | H05K 7/1432 |
| | | | | 361/735 |
| 2016/0241155 | A1* | 8/2016 | Takeuchi | H02M 7/003 |

* cited by examiner

ELECTRIC POWER CONVERTER

CROSS-REFERENCE TO RELATED APPLICATION

This application is based on and claims the benefit of priority from earlier Japanese Patent Applications No. 2014-214599 filed Oct. 21, 2014, the description of which is incorporated herein by reference.

TECHNICAL FIELD

The present disclosure relates to an electric power converter provided with a capacitor having a pair of end-face-electrodes disposed on both end faces of an element body.

BACKGROUND

There is an electric power converter provided with semiconductor modules and a capacitor. Since the capacitor has ESR (equivalent series resistance), the capacitor generates heat by ripple current flowing therein. Further, although downsizing of the capacitor is requested along with downsizing of the electric power converter being demanded, ESR value tends to increase when the size of the capacitor is downsized such that the capacitor more easily generates heat.

Moreover, each of the semiconductor modules has a built-in switching element, and heat is generated by the flowing controlled current through the switching element. Such a heat is transmitted to the capacitor through bus bars, thus the temperature of the capacitor may rise.

Therefore, in order to cool the capacitor, a capacitor disposed on a heat sink is disclosed in the Japanese Patent Application Laid-Open Publication No. 2002-83915. The capacitor disclosed in the Publication No. 2002-83915 is fixed in a position such that a bottom surface thereof is in contact with the heat sink. Thereby, the capacitor is cooled from the bottom surface thereof.

However, directions or postures of a pair of end-face-electrodes (so-called metallikon surfaces) provided on both end faces of an element body of the capacitor relative to the heat sink are not described at all in the Publication No. 2002-83915. From a viewpoint of improving cooling performance of a capacitor, simply mounting the capacitor on the heat sink as disclosed in the Publication No. 2002-83915 is not sufficient, and there is room for improvement.

SUMMARY

An embodiment provides an electric power converter capable of improving cooling performance of a capacitor.

An electric power converter according to one aspect includes a semiconductor module constituting a power conversion circuit, a capacitor electrically connected to the semiconductor module, and a cooling member for cooling the capacitor. The capacitor includes an element body provided with an internal electrode, and a pair of end-face-electrodes provided on both end faces of the element body and connected to the internal electrode.

The pair of end-face-electrodes are connected with a pair of bus bars, respectively, in a manner of surface contact. The capacitor is disposed in a state where at least one of the pair of end-face-electrodes is facing the cooling member. The end-face-electrode facing the cooling member is in contact with the cooling member via the bus bar.

In the electric power converter, the capacitor is disposed in the state where at least one of the pair of end-face-electrodes is facing the cooling member. Then, the end-face-electrode facing the cooling member is in contact with the cooling member via the bus bar. Thereby, the capacitor can be cooled from the end-face-electrodes, thus it is possible to improve the overall cooling performance of the capacitor. That is, the heat inside the element body of the capacitor is transferred to the end-face-electrodes through the internal electrode having high thermal conductivity. This makes it possible to shorten a heat transfer distance from the entire capacitor to the cooling member, thus the overall cooling performance of the capacitor can be improved.

Moreover, since the bus bar is brought into contact with the cooling member, heat generated in the semiconductor module is hardly transmitted through the bus bar. Therefore, it is possible to effectively suppress the temperature of the capacitor from rising.

As described above, according to the present disclosure, it is possible to provide the electric power converter capable of improving the cooling performance of the capacitor.

DETAILED DESCRIPTION OF THE PREFERRED EMBODIMENTS

An electric power converter of the present disclosure can be used, for example, in an electric vehicle or a hybrid vehicle.

[First Embodiment]

An embodiment of an electric power converter 1 will be described with reference to FIG. 1 to FIG. 4.

Figure 1:
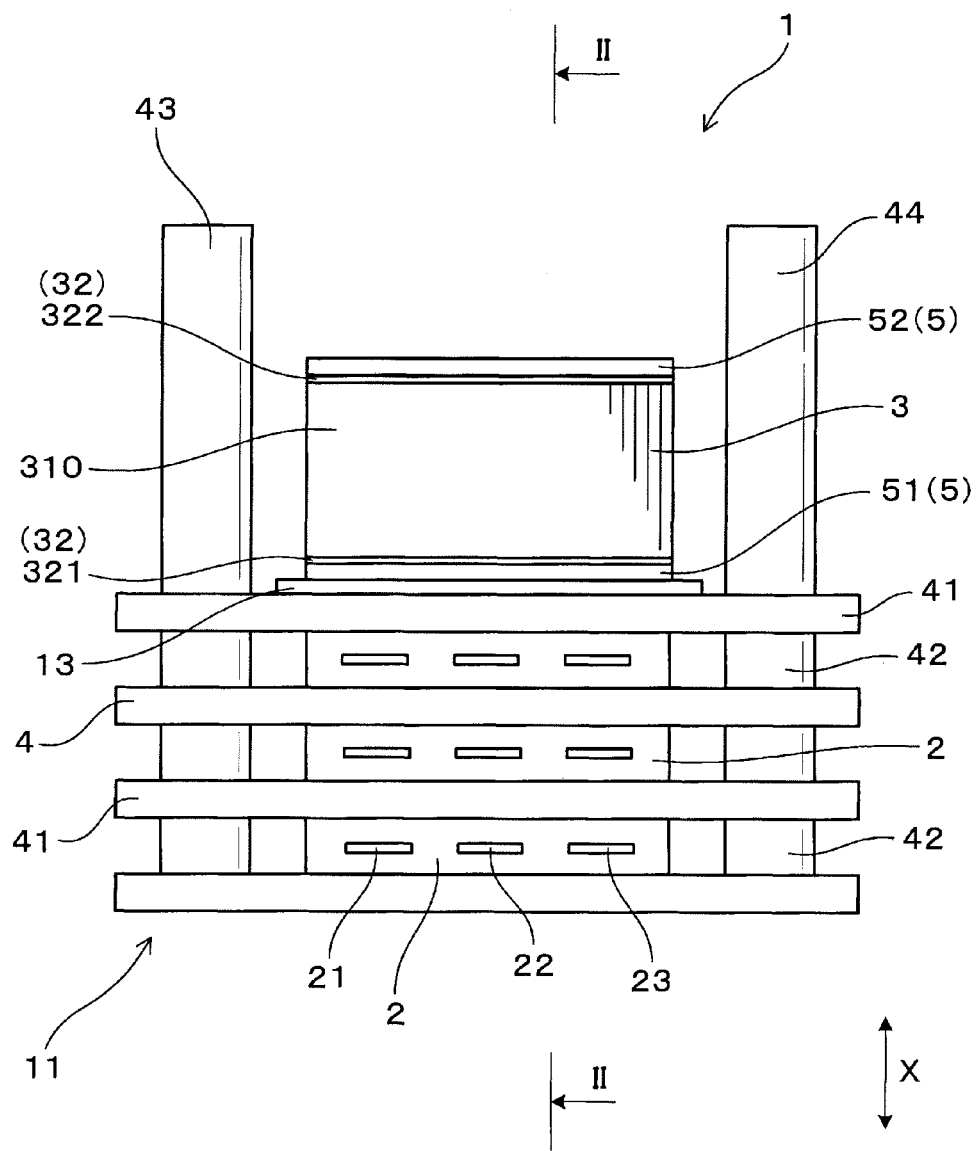
FIG. 1 shows a top view of an electric power converter in a first embodiment.
Figure 2:
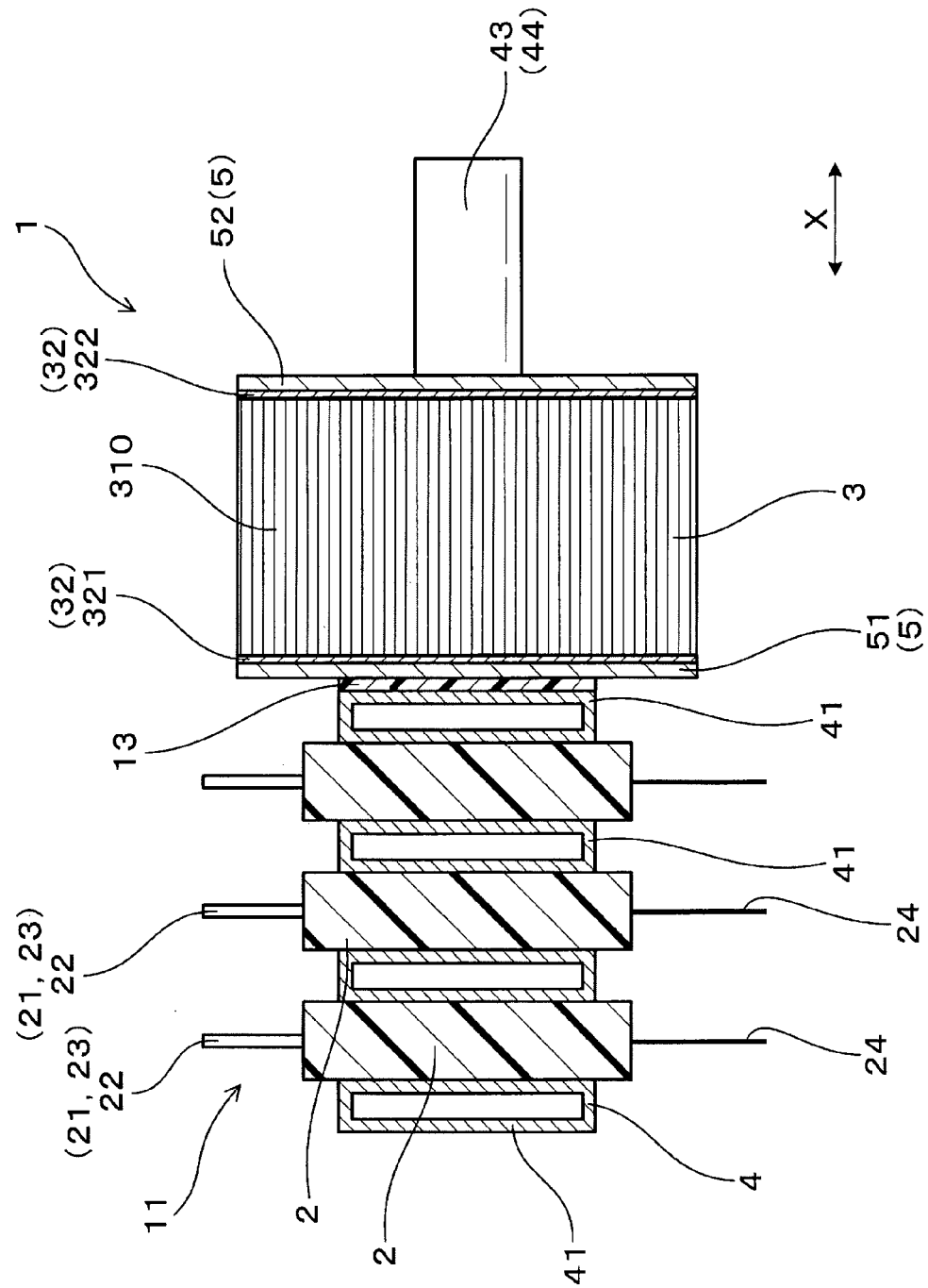
FIG. 2 shows a sectional view taken along a line II-II in FIG. 1.

As shown in FIGS. 1 and 2, the electric power converter 1 of the present embodiment has semiconductor modules 2 constituting an electric power conversion circuit, a capacitor 3 electrically connected to the semiconductor modules 2, and a cooling member 4 for cooling the capacitor 3.

As shown in FIGS. 1 to 4, the capacitor 3 includes an element body 310 provided with internal electrodes 31, and a pair of end-face-electrodes 32 provided on both end faces of the element body 310 and connected to the internal electrodes 31. The pair of end-face-electrodes 32 are connected with a pair of bus bars 5, respectively, in a manner of surface contact. As shown in FIGS. 1 and 2, the capacitor 3 is disposed in a state where one of the pair of end-face-electrodes 32 is facing towards the cooling member 4. The end-face-electrode 32 facing the cooling member 4 is in contact with the cooling member 4 via the bus bar 5.

Each of the semiconductor modules 2 is composed of a switching element such as an IGBT (insulated gate bipolar transistor) and a diode such as a FWD (free wheel diode) therein. Further, as shown in FIG. 2, each of the semiconductor modules 2 has a positive electrode terminal 21, a negative electrode terminal 22, an AC terminal 23, and a control terminal 24 that projects towards opposite relative to the other terminals.

Although not shown, the positive electrode terminal 21 and the negative electrode terminal 22 are electrically connected to the capacitor 3 through the bus bar 5, and the AC terminal 23 is electrically connected to an AC load (not shown). Further, the control terminal 24 is electrically connected to a control circuit board (not shown) for controlling switching operations of the semiconductor modules 2.

As shown in FIG. 1, the cooling member 4 is configured not only to cool the capacitor 3, but also to cool the semiconductor modules 2. The cooling member 4 includes a plurality of cooling tubes 41 and a plurality of connecting pipes 42 that connect the plurality of cooling pipes 41 to each other at both ends in a longitudinal direction. Moreover, as shown in FIGS. 1 and 2, the semiconductor modules 2 and the cooling tubes 41 are alternately stacked to form a stacked semiconductor unit 11. That is, each of the semiconductor modules 2 is sandwiched by a pair of cooling tubes 41 from both main surfaces thereof. In the present embodiment, the cooling member 4 is made of metal that is excellent in thermal conductivity such as aluminum or the like.

Note that a stacking direction of the semiconductor modules 2 and the cooling pipes 41 is referred to simply as a stacking direction in the present embodiment. A coolant inlet pipe 43 and a coolant outlet pipe 44 for introducing and discharging a coolant into and from the cooling pipes 41 are with connected a cooling pipe 41 disposed on one end in the stacking direction so as to protrude in the stacking direction. Then, in the following, as appropriate, a side on which the coolant inlet pipe 43 and the coolant outlet pipe 44 are protruded in the stacking direction is referred to as a forward side, and another side is referred to as a rear side.

The coolant introduced from the coolant inlet pipe 43 passes through the connecting pipes 42 appropriately, and is distributed to each cooling tube 41 and flows in the longitudinal direction thereof. Then, the coolant exchanges heat with the semiconductor modules 2 during flowing through the cooling pipes 41. The coolant of which the temperature is raised by heat exchange passes through the connecting pipes 42 on the downstream side appropriately, then is guided to the coolant outlet pipe 44, and is discharged from the cooling member 4.

As for a coolant, for example, a natural coolant such as ammonia or water, water mixed with ethylene glycol-based antifreeze, a fluorocarbon-based coolant such as FLUORINERT (registered trademark), another fluorocarbon-based coolant such as HCFC123 or HFC134a, a methanol, an alcohol-based coolant such as an alcohol, or a ketone-based coolant such as an acetone can be used.

As shown in FIG. 1, the capacitor 3 is disposed between the coolant inlet pipe 43 and the coolant outlet pipe 44, and is disposed in front of a cooling pipe 41 disposed at a front end of the cooling member 4 in the present embodiment. Further, the capacitor 3 is disposed in a state where one of the pair of end-face-electrodes 32 is facing towards the cooling member 4, and the end-face-electrode 32 facing the cooling member 4 is in contact with a front face of the cooling member 4 via the bus bar 5.

Figure 3:
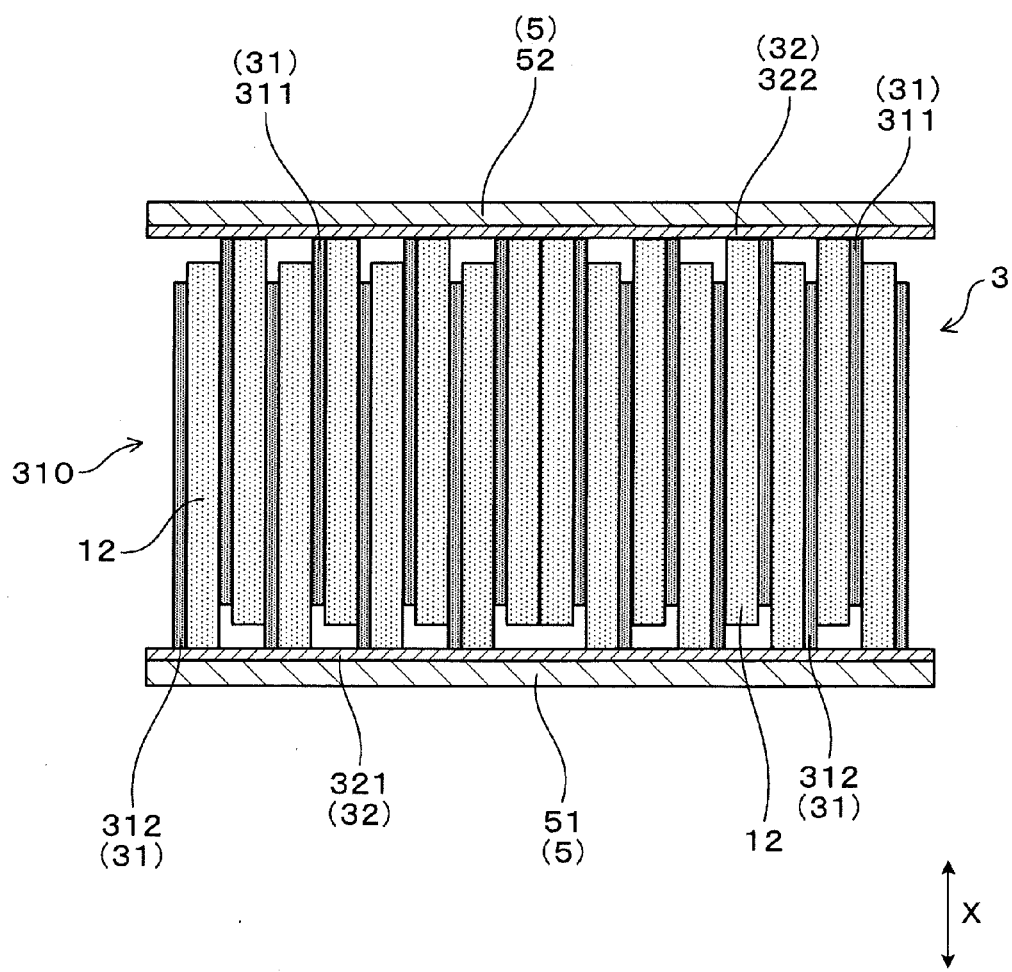
FIG. 3 shows a sectional view of a capacitor and bus bars in the first embodiment.

In the present embodiment, the capacitor 3 is a film capacitor. As shown in FIG. 3, the element body 310 of the capacitor 3 is formed such that positive internal electrodes 311 that are the internal electrodes 31 that charge positive charges and negative internal electrodes 312 that are the internal electrodes 31 that charge negative charges face each other via insulating dielectric films 12, and is formed by rolling them up. The positive internal electrodes 311 and the negative internal electrodes 312 are offset in a rolling axis direction (i.e., an axial direction). The internal electrodes 31 are deposited on the dielectric films 12.

The pair of end-face-electrodes 32 are disposed on both end faces of the element body 310 in the rolling axis direction. The pair of end-face-electrodes 32 are facing to each other in the rolling axis direction of the internal electrodes 31. Then, one end of the positive internal electrode 311 is connected to the positive end-face-electrode 321 that is one of the end-face-electrodes 32, and one end of the negative internal electrode 312 is connected to the negative end-face-electrode 322 that is another one of the end-face-electrodes 32. The positive internal electrodes 311 are apart from the negative end-face-electrode 322, and the negative internal electrodes 312 are apart from the positive end-face-electrode 321. In the following, an aligning direction of the pair of end-face-electrodes 32 is referred to simply as an aligning direction X.

The pair of end-face-electrodes 32 are formed, for example, by thermally spraying a metal such as aluminum onto the both ends of the element body 310 in the aligning direction X. As shown in FIGS. 1 and 2, the capacitor 3 is disposed in a state where the positive end-face electrode 321 among the pair of end-face-electrodes 32 is facing towards the cooling member 4 in the present embodiment.

Figure 4:
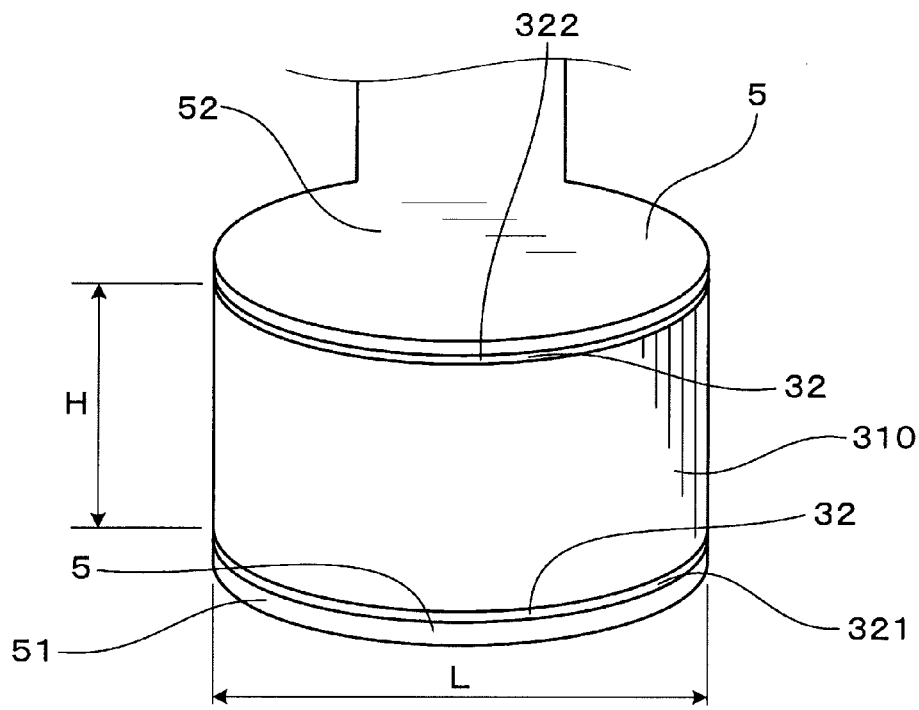
FIG. 4 shows a perspective view of the capacitor and the bus bars in the first embodiment

As shown in FIG. 4, a dimension H of the element body 310 in the aligning direction X of the pair of end-face electrodes 32 is smaller than a maximum dimension among external dimensions of the element body 310 in a direction perpendicular to the aligning direction X. For example, when viewed from the aligning direction X, and when the element body 310 has an elliptical shape as shown in FIG. 4, the dimension H of the element body 310 in the aligning direction X is smaller than a major axis L of the element body 310 when viewed from the aligning direction X.

The bus bars 5 are connected to main surfaces of the pair of end-face-electrodes 32 opposite to the element body 310, respectively. As shown in FIG. 4, the entire surfaces of the pair of end-face-electrodes 32 opposite to the element body 310 are connected to the bus bars 5, respectively. That is, the bus bars 5 and the end-face-electrodes 32 are joined by conductive adhesive disposed on the entire surfaces of the end-face-electrodes 32.

The positive electrode bus bar 51 that is electrically connected to the positive electrode terminals 21 of the semiconductor modules 2 is connected to the positive end-face-electrode 321. Moreover, the negative electrode bus bar 52 that is electrically connected to the negative electrode terminals 22 of the semiconductor modules 2 is connected the negative end-face-electrode 322 of the semiconductor module 2.

As shown in FIGS. 1 and 2, a surface of the positive electrode bus bar 51 opposite to the capacitor 3 is in contact with a front end face of the cooling pipe 41 disposed at the front end of the cooling member 4. Thus, the positive end-face-electrode 321 that is the end-face-electrode 32 facing the cooling member 4 is in contact with the cooling member 4 via the positive bus bar 51. The positive end-face-electrode 321, the positive electrode bus bar 51, and the front end face of the cooling pipe 41 disposed at the front end of the cooling member 4 are aligned so that normal directions of each main surface are the same.

Note that an insulating member 13 having thermal conductivity is disposed on a contacting surface of the cooling member 4 to the bus bar 5. In the present embodiment, the insulating member 13 is disposed on the front end face of the cooling pipe 41 disposed at the front end of the cooling member 4. In other words, the insulating member 13 is interposed between the cooling member 4 and the bus bar 5. The insulating member 13 is made of a ceramic plate, a resin film or the like, for example.

In other words, an expression that the bus bar 5 is in contact with the cooling member 4 is not limited only to a case where the bus bar 5 is in contact directly with the cooling member 4, but also includes a case where the bus bar 5 is in contact with the cooling member 4 via a member having thermal conductivity.

Next, functions and effects of the present embodiment will be described.

In the electric power converter 1, the capacitor 3 is disposed in a state where the end-face-electrode 32 is facing the cooling member 4. In addition, the end-face-electrode 32 facing the cooling member 4 is in contact with the cooling member 4 via the bus bar 5. This makes it possible to shorten a heat transfer distance from the entire capacitor 3 to the cooling member 4, thus the overall cooling performance of the capacitor 3 can be improved.

Moreover, since the bus bar 5 is brought into contact with the cooling member 4, heat generated in the semiconductor module 2 is hardly transmitted through the bus bar 5. Therefore, it is possible to effectively suppress the temperature of the capacitor 3 from rising.

In addition, the entire surface of the end-face-electrode 32 opposite to the element body 310 is connected to the bus bar 5. Therefore, the heat of the end-face-electrodes 32 can be efficiently dissipated by the cooling member 4 through the bus bar 5. This makes it possible to improve the cooling performance of the entire capacitor 3.

In addition, the dimension H of the element body 310 in the aligning direction X is smaller than the maximum dimension (the major axis L) among the external dimensions of the element body 310 in the direction perpendicular to the aligning direction X. Hence, since it is possible to shorten the heat transfer distance in the aligning direction X of the entire capacitor 3, it is possible to improve the overall cooling performance of the capacitor 3. Moreover, since it is possible to shorten a current path in the capacitor 3, it is possible to reduce the ESR in the capacitor 3, thus it is possible to suppress the heat from being generated in the capacitor 3.

As described above, according to the present embodiment, it is possible to provide the electric power converter capable of improving the cooling performance of the capacitor.

[Second Embodiment]

Figure 5:
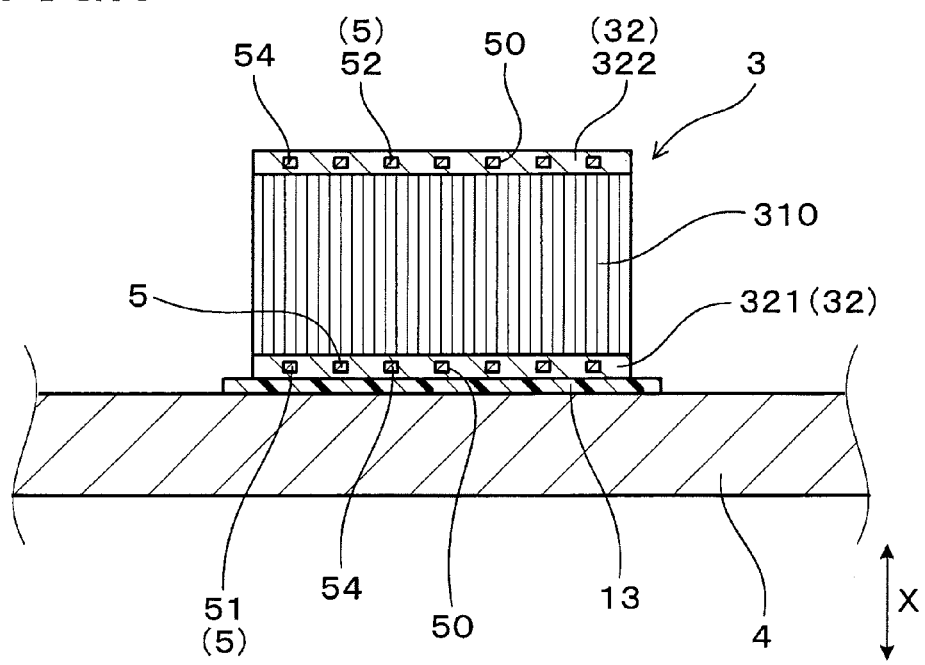
FIG. 5 shows a sectional view of a capacitor, bus bars, and a cooling member in a second embodiment.
Figure 6:
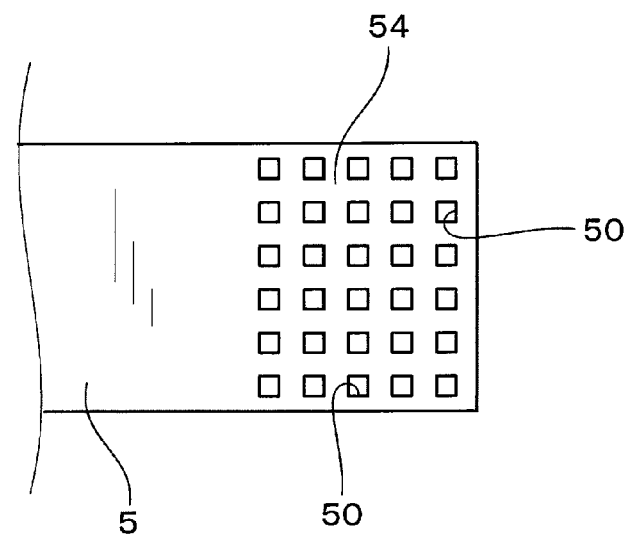
FIG. 6 shows a top view of the bus bars in the second embodiment.

As shown in FIGS. 5 and 6, the present embodiment is an example of an electric power converter 1 of which bus bars 5 are embedded in end-face-electrodes 32.

As shown in FIG. 6, a terminal embedding portion 54, which is a portion of the bus bar 5 embedded in the end-face-electrode 32 in the present embodiment, has a mesh shape. That is, the terminal embedding portion 54 of the bus bar 5 has a plurality of through holes 50 penetrating in a thickness direction. As shown in FIG. 5, the end-face-electrode 32 is formed in a periphery of the terminal embedding portion 54 and in the through holes 50.

In the present embodiment, an end face of the end-face-electrode 32 opposite to the element body 310 that faces the cooling member 4 is in contact with the cooling member 4. Thus, the end-face-electrode 32 facing the cooling member 4 is in contact with the cooling member 4 via the terminal embedding portion 54 embedded therein. An insulating member 13 is disposed on a contacting surface of the end-face-electrode 32 to the cooling member 4.

A connection of the terminal embedding portion 54 of the bus bar 5 to the capacitor 3 can be carried out, for example, as follows.

The terminal embedded portion 54 is placed on an end face of the element body 310. Then, a metal such as aluminum is sprayed towards the end face of the element body 310 from the top of the terminal embedded portion 54. Thereby, while the sprayed metal enters between the terminal embedding portion 54 and the element body 310 through the through holes 50, the sprayed metal is also disposed in the through holes 50 and on an opposite side of the element body 310 in the terminal embedding portion 54, and the end-face-electrode 32 in a state where the terminal embedded portion 54 is embedded is formed.

The remainder is the same as in the first embodiment. Note that among the reference numerals used in the present embodiment and the drawings relating to the present embodiment, the same reference numerals as used in the first embodiment represent the same elements as the first embodiment unless otherwise indicated.

The present embodiment has the same functions and effects as in the first embodiment.

[Third Embodiment]

Figure 7:
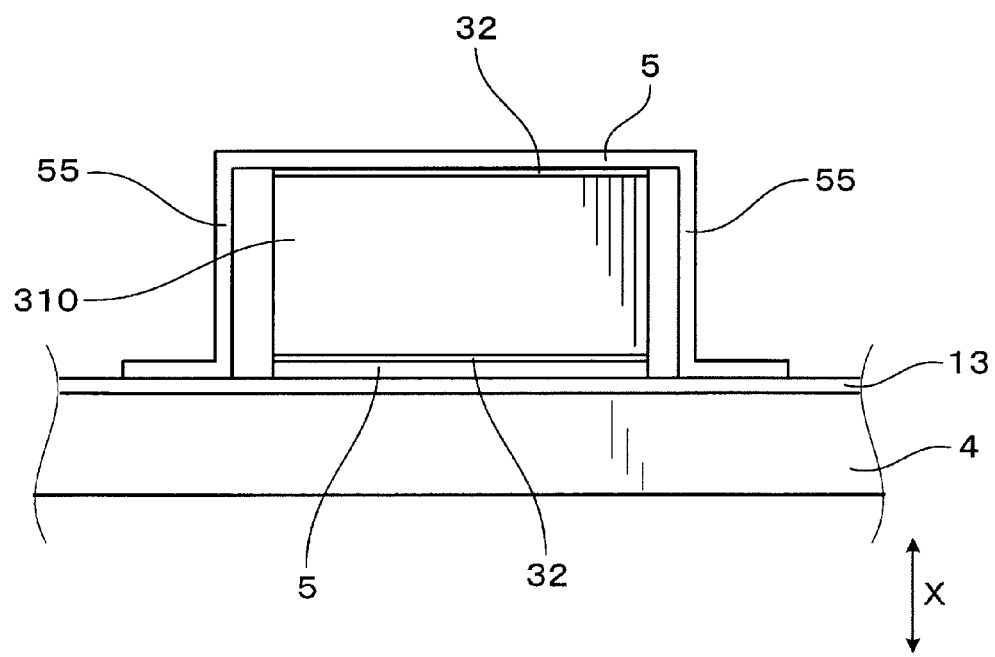
FIG. 7 shows a front view of a capacitor, bus bars, and a cooling member in a third embodiment.
Figure 8:
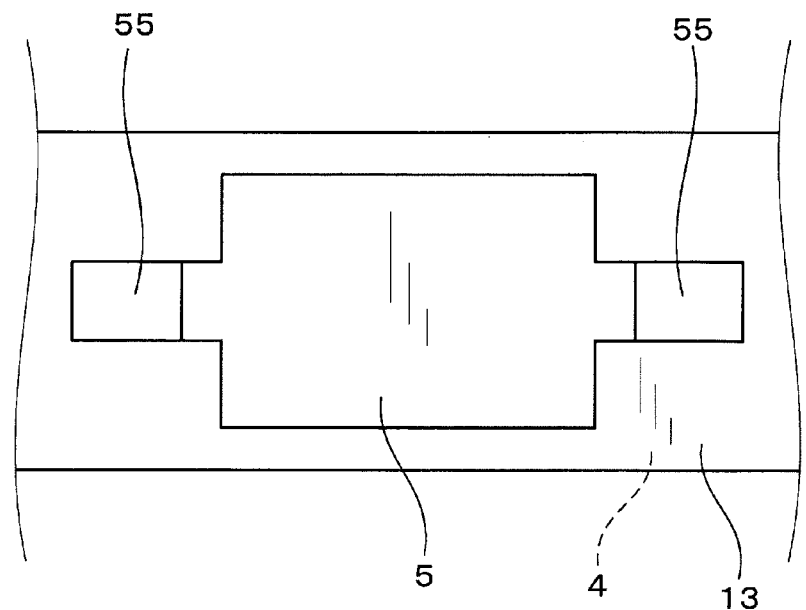
FIG. 8 shows a top view of the capacitor, the bus bars and the cooling member in the third embodiment.

As shown in FIGS. 7 and 8, the present embodiment is an example that both of a pair of bus bars 5 connected to a pair of end-face-electrodes 32 are in contact with a cooling member 4. One of the end-face-electrodes 32 faces the cooling member 4 also in the present embodiment.

The bus bar 5 connected to the end-face-electrode 32 facing an opposite side of the cooling member 4 has heat transfer portions 55 that are disposed so as to contact a part of the cooling member 4. That is, the heat transfer portions 55 are extended from portions surface contacting the end-face-electrode 32 facing the opposite side of the cooling member 4 in the bus bar 5 towards the cooling member 4 so as to contact the cooling member 4. Then, the portions in the heat transfer portions 55 contacting the cooling member 4 are disposed along the cooling member 4. Note that an insulating member 13 is disposed between the heat transfer portions 55 and the cooling member 4.

The remainder is the same as in the first embodiment. Note that among the reference numerals used in the present embodiment and the drawings relating to the present embodiment, the same reference numerals as used in the first embodiment represent the same elements as the first embodiment unless otherwise indicated.

In the case of the present embodiment, the heat can be dissipated to the cooling member 4 also from one of the pair of bus bars 5 that is disposed on the opposite side of the cooling member 4 through the heat transfer portions 55. Therefore, it is possible to cool the capacitor 3 efficiently from both of the pair of end-face-electrodes 32 through the bus bars 5.

The remainder has the same functions and effects as in the first embodiment.

[Fourth Embodiment]

Figure 9:
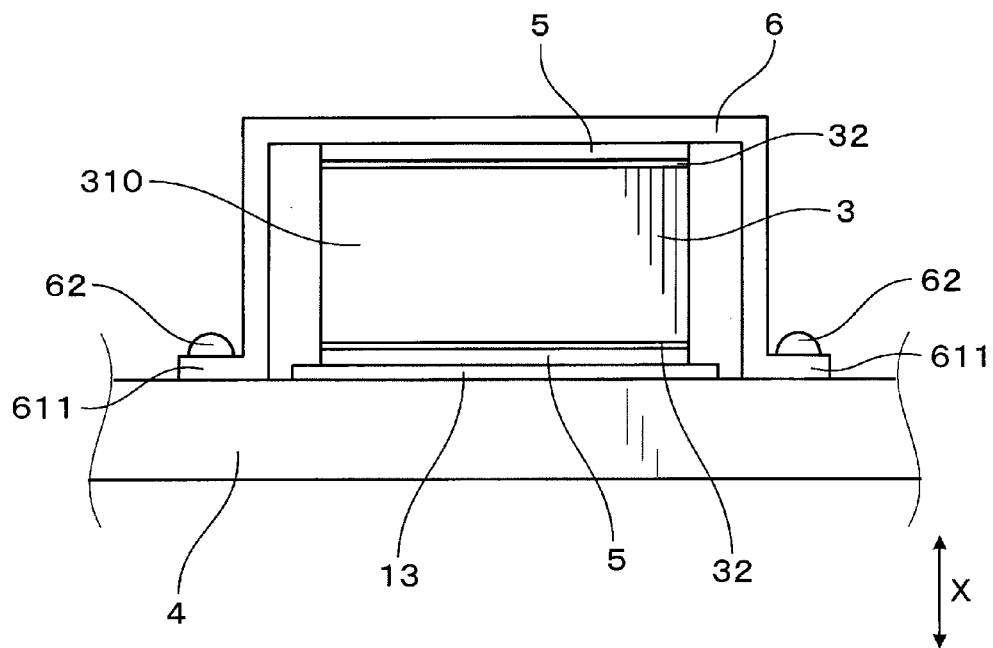
FIG. 9 shows a front view of a capacitor, bus bars, a cooling member, and a body pressing member in a fourth embodiment.
Figure 10:
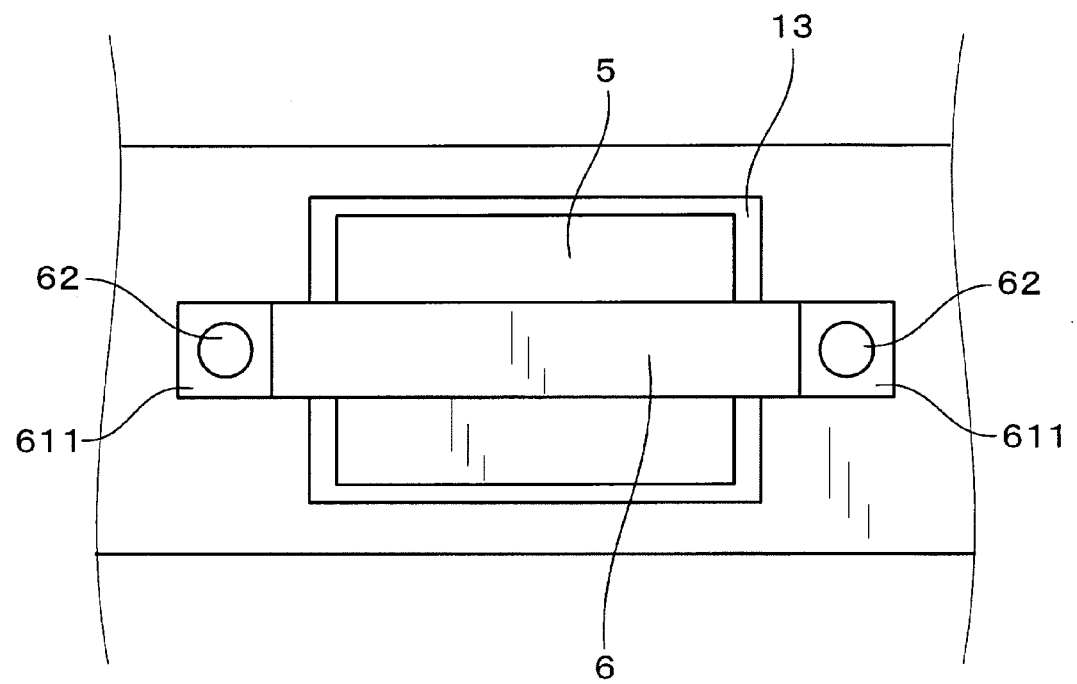
FIG. 10 shows a top view of the capacitor, the bus bars, the cooling member, and the body pressing member in the fourth embodiment.

As shown in FIGS. 9 and 10, the present embodiment is an example of an electric power converter 1 that includes a body pressing member 6 for pressing a capacitor 3 to a cooling member 4.

The body pressing member 6 is made of a belt-like metal member, for example, and presses the capacitor 3 against the cooling member 4 from an opposite side of the cooling member 4. In addition, the body pressing member 6 is fastened to the cooling member 4 by bolts 62 at flange portions 611 formed at both ends thereof. Thereby, the capacitor 3 is held in a state of being pressed against the cooling member 4 by the body pressing member 6. Note that an elastic member may be disposed between the body pressing member 6 and a bus bar 5.

The remainder is the same as in the first embodiment. Note that among the reference numerals used in the present embodiment and the drawings relating to the present embodiment, the same reference numerals as used in the first embodiment represent the same elements as the first embodiment unless otherwise indicated.

In the case of the present embodiment, since the capacitor 3 is pressed against the cooling member 4 by the body pressing member 6, it is possible to increase a contacting area between the cooling member 4 and the bus bar 5. Therefore, it is possible to further improve the cooling performance of the capacitor 3.

In addition, by constituting the body pressing member 6 with a member having high thermal conductivity such as a metal, the heat can be dissipated to the cooling member 4 also from an end-face-electrode 32, which is disposed on the opposite side of the cooling member 4, of the capacitor 3 through the bus bar 5 and the body pressing member 6.

The remainder has the same functions and effects as in the first embodiment.

[Fifth Embodiment]

Figure 11:
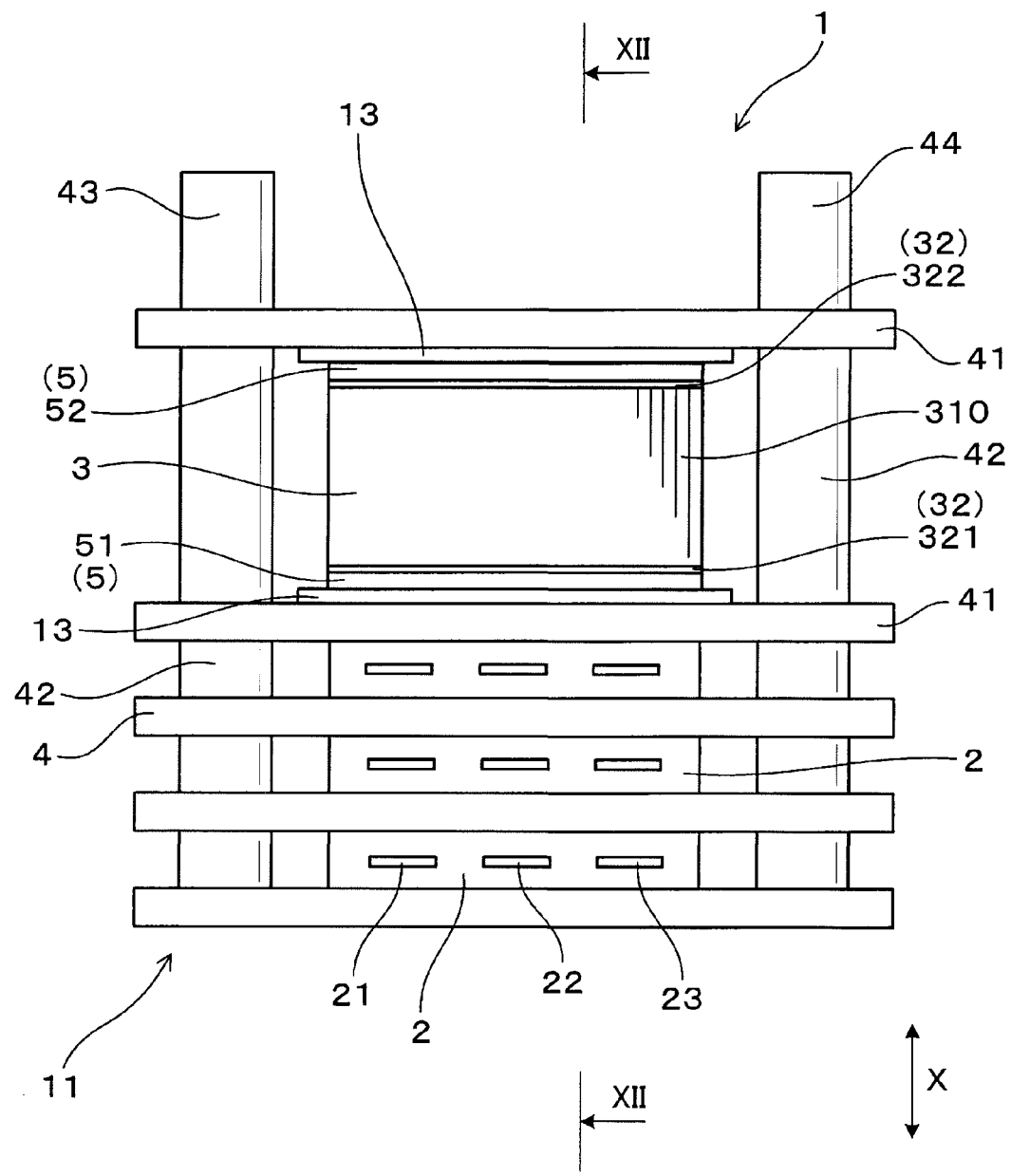
FIG. 11 shows a top view of an electric power converter in a fifth embodiment.
Figure 12:
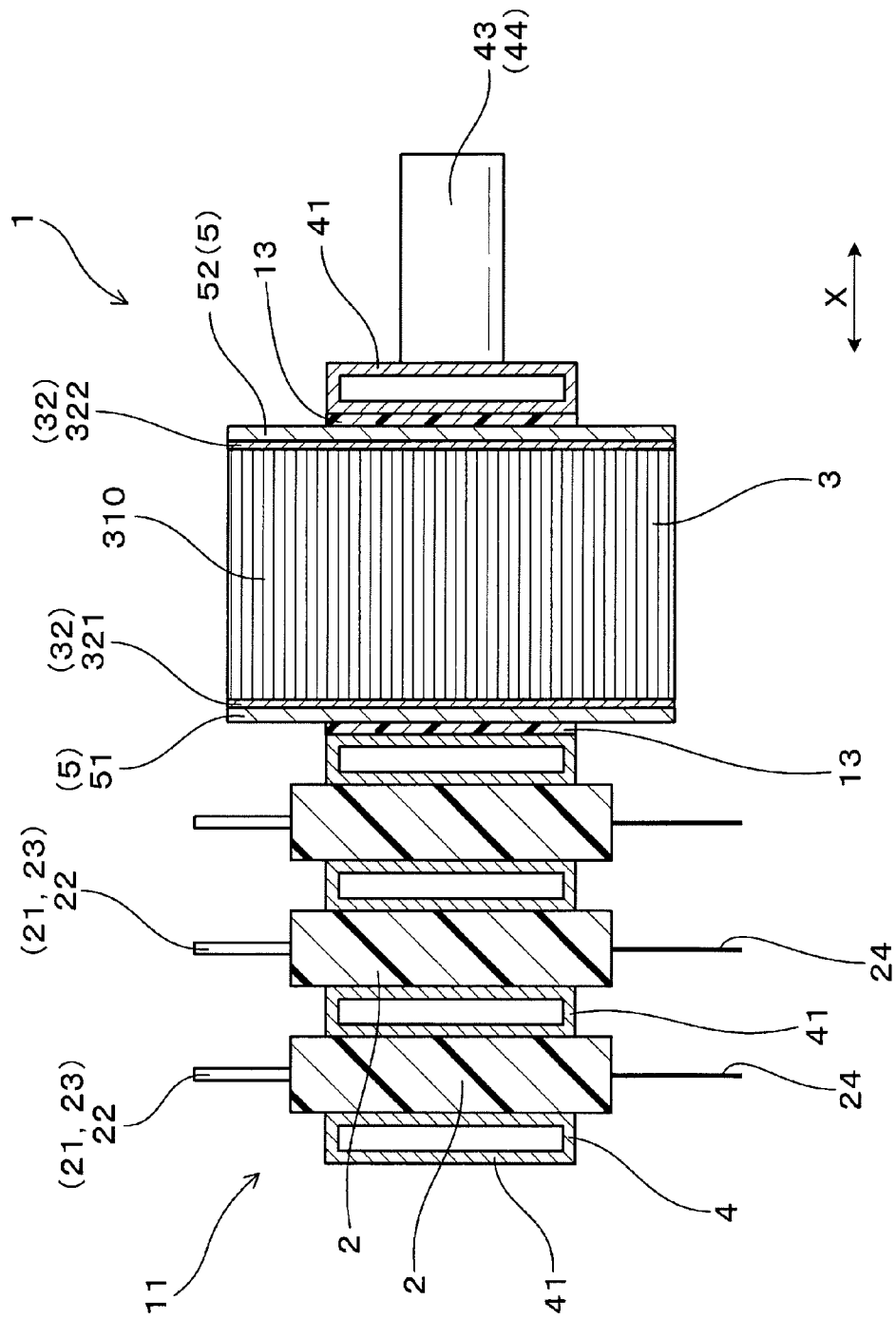
FIG. 12 shows a sectional view taken along a line XI-XII in FIG. 11.

As shown in FIGS. 11 and 12, the present embodiment is an example of a cooling member 4 facing both of a pair of end-face-electrodes 32, while each of the pair of end-face-electrode 32 is in contact with the cooling member 4 via a bus bar 5.

A capacitor 3 is disposed in a state such that the cooling member 4 faces both a positive end-face-electrode 321 and a negative end-face-electrode 322. Then, the capacitor 3 is disposed so as both a main surface of a positive bus bar 51 disposed opposite to the capacitor 3 and a main surface of a negative bus bar 52 disposed opposite to the capacitor 3 to be in contact with the cooling member 4.

In the present embodiment, the capacitor 3 is interposed between two cooling pipes 41 adjoining in an aligning direction X. That is, the electric power converter of the present embodiment has a structure that the capacitor 3 is sandwiched between the two cooling pipes 41 adjoining in the aligning direction X among a plurality of cooling pipes 41 composing the cooling member 4.

Note that insulating members 13 are disposed on contacting surfaces of the bus bars 5 (the positive bus bar 51 and the negative electrode bus bar 52) to the cooling member 4 also in the present embodiment.

The remainder is the same as in the first embodiment. Note that among the reference numerals used in the present embodiment and the drawings relating to the present embodiment, the same reference numerals as used in the first embodiment represent the same elements as the first embodiment unless otherwise indicated.

In the case of the present embodiment, the capacitor 3 can be cooled from both the pair of end-face-electrodes 32, thus it is possible to further improve the overall cooling performance of the capacitor 3.

The remainder has the same functions and effects as in the first embodiment.

[Sixth Embodiment]

As shown in FIGS. 13 to 16, the present embodiment is an example that structures of a cooling member 4, a semiconductor module 2, etc. are changed with respect to the first embodiment.

Figure 13:
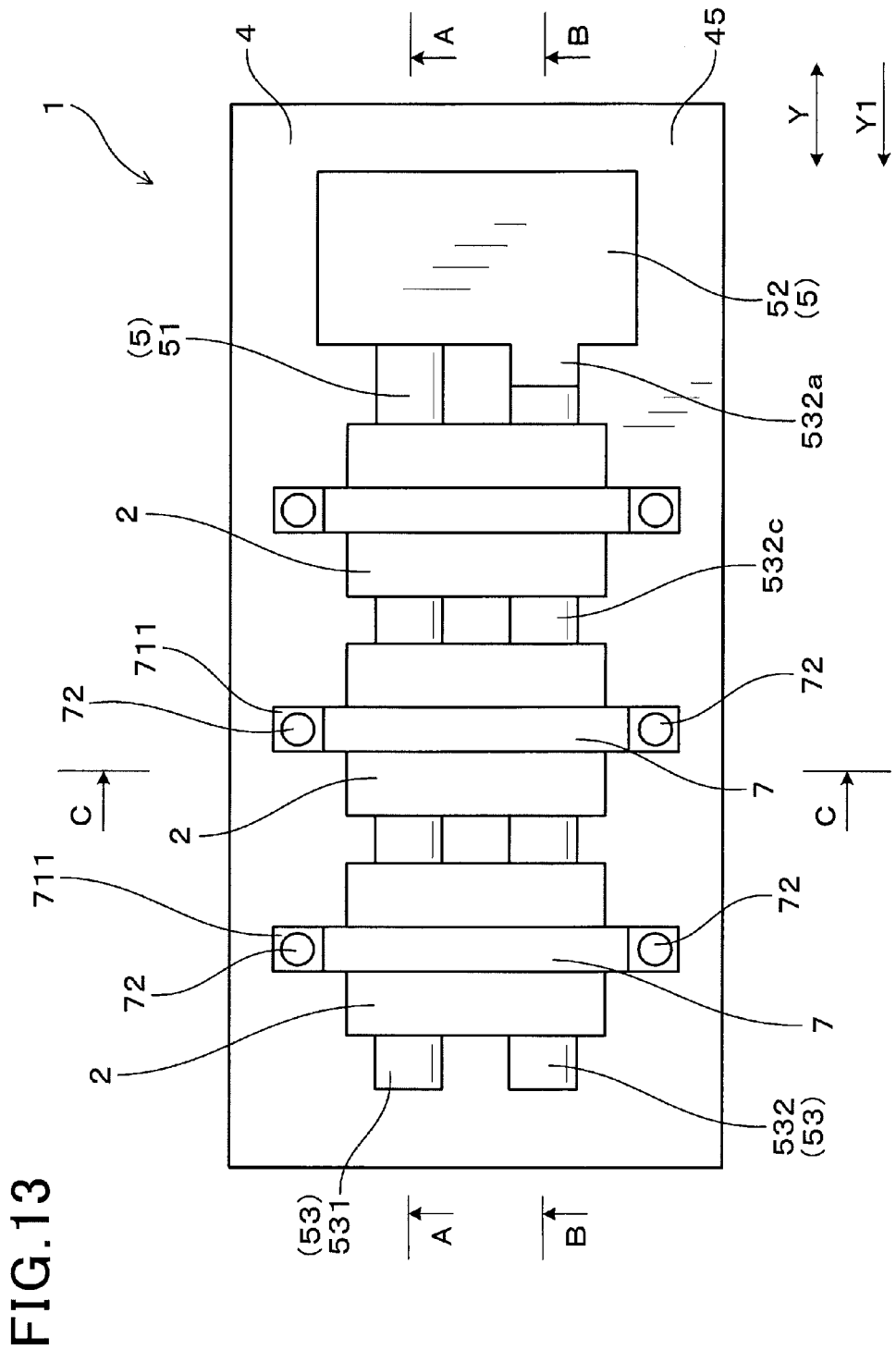
FIG. 13 shows a top view of an electric power converter in a sixth embodiment.

In the present embodiment, the cooling member 4 has a substantially rectangular parallelepiped shape and has a mounting surface 45 on one of its surfaces. Then, three semiconductor modules 2 and a capacitor 3 are mounted on the mounting surface 45 of the cooling member 4. As shown in FIG. 13, three semiconductor modules 2 and the capacitor 3 are aligned side by side on a straight line. In the following, as appropriate, a direction that three semiconductor modules 2 and the capacitor 3 are aligned is referred to as a lateral direction Y. One side of the capacitor 3 in the lateral direction Y (hereinafter, suitably referred to as a Y1 side.), three semiconductor modules 2 are disposed.

Figure 14:
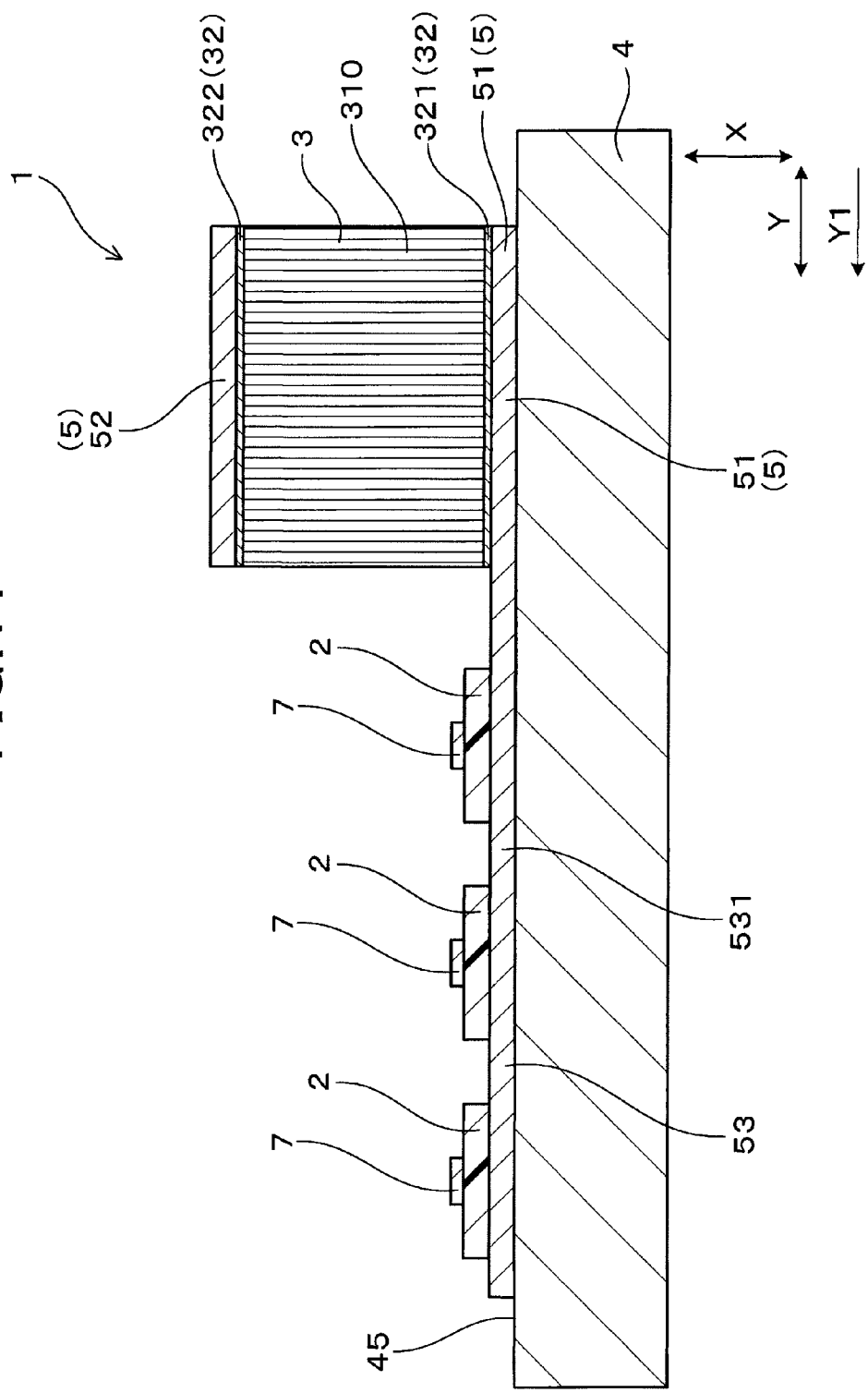
FIG. 14 shows a sectional view taken along a line A-A in FIG. 13.
Figure 15:
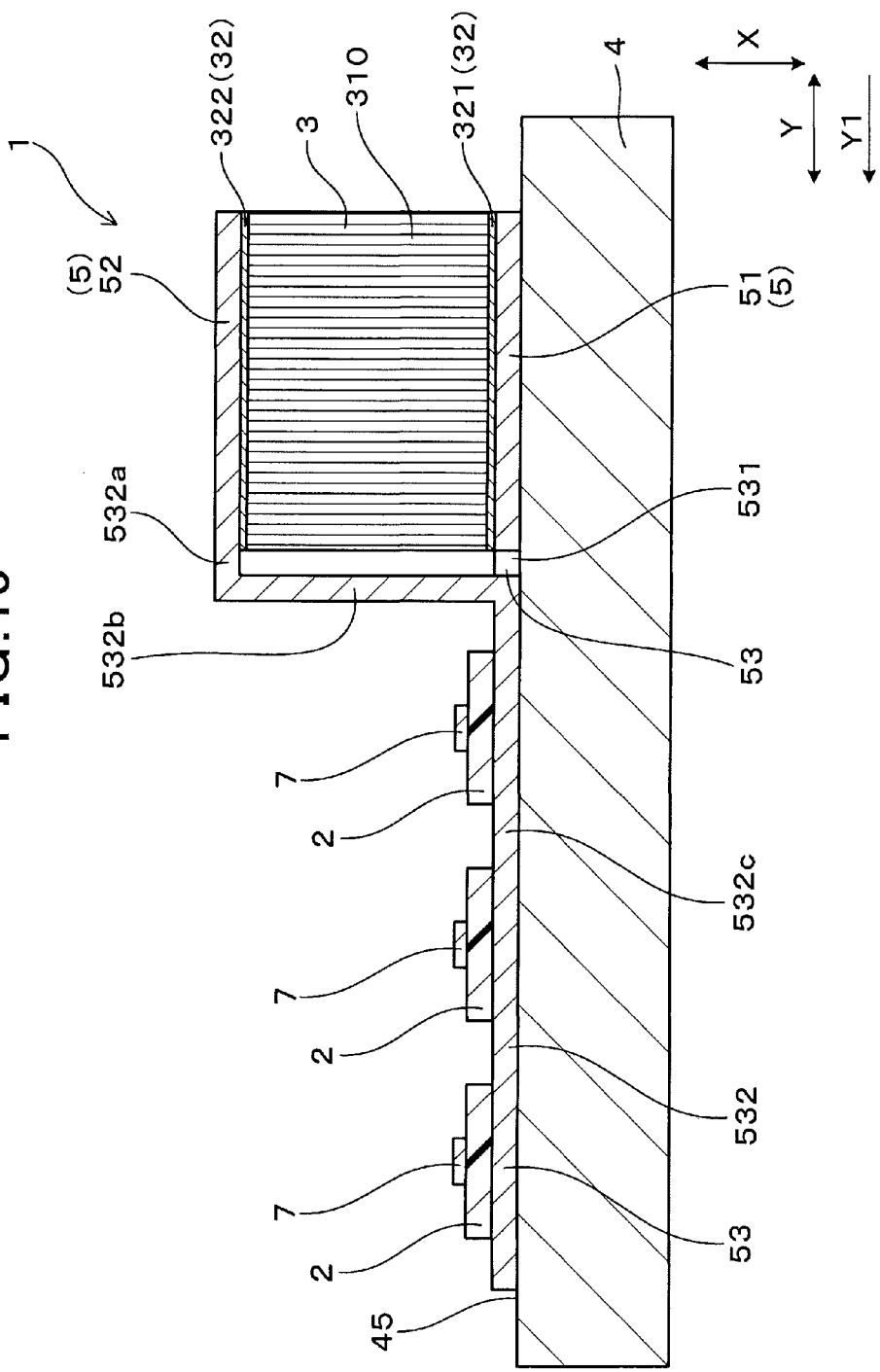
FIG. 15 shows a sectional view taken along a line B-B in FIG. 13.

As shown in FIGS. 14 and 15, the capacitor 3 is disposed so that the aligning direction X of the pair of end-face-electrodes 32 becomes a normal direction of the mounting surface 45 of the cooling member 4. That is, one of the pair of end-face-electrodes 32 faces the cooling member 4. In the same manner as in the first embodiment, the capacitor 3 in the present embodiment is mounted on the mounting surface 45 of the cooling member 4 in a state where a positive end-face electrode 321 faces the cooling member 4.

As shown in FIGS. 13 to 15, bus bars 5 have extended portions 53 that extend in a direction perpendicular to the aligning direction X of the pair of end-face-electrodes 32. As shown in FIGS. 13 and 14, a positive electrode bus bar 51 has a positive extended portion 531 that extends in the Y1 side as the extended portion 53. As shown in FIGS. 13 and 15, a negative electrode bus bar 52 has a negative extended portion 532 that extends in the Y1 side as the extended portion 53. The negative extended portion 532 is composed of a first negative extended portion 532a, a second negative extended portion 532b extending from an end of the first negative extended portion 532a to the mounting surface 45 of the cooling member 4, and a third negative extended portion 532c extending from the second negative extended portion 532b in the Y1 side.

As shown in FIG. 13, the respective positive extended portion 531 and negative extended portion 532 are disposed in a straight line in the lateral direction Y. Further, the positive extended portion 531 and the negative extended portion 532 are disposed side by side in a direction perpendicular to the lateral direction Y when viewed from the aligning direction X.

As shown in FIGS. 14 and 15, the positive extended portion 531 of the bus bar 5 and the third negative extended portion 532c of the negative extended portion to 532 abut on the mounting surface 45 of the cooling member 4, and are disposed along the mounting surface 45. In other words, both the pair of bus bars 5 connected to the pair of end-face-electrodes 32 abut the cooling member 4. Note that although not shown, an insulating member (reference numeral 13 in FIG. 1, etc.) is interposed between the bus bars 5 and the cooling member As shown in FIGS. 13 to 15, three semiconductor modules 2 are disposed on main surfaces of the positive extended portion 531 and the third negative extended portion 532c opposite to the cooling member 4 with predetermined intervals in the lateral direction Y. That is, as shown in FIGS. 14 and 15, the extended portions 53 are interposed between the cooling member 4 and the semiconductor modules 2.

Figure 16:
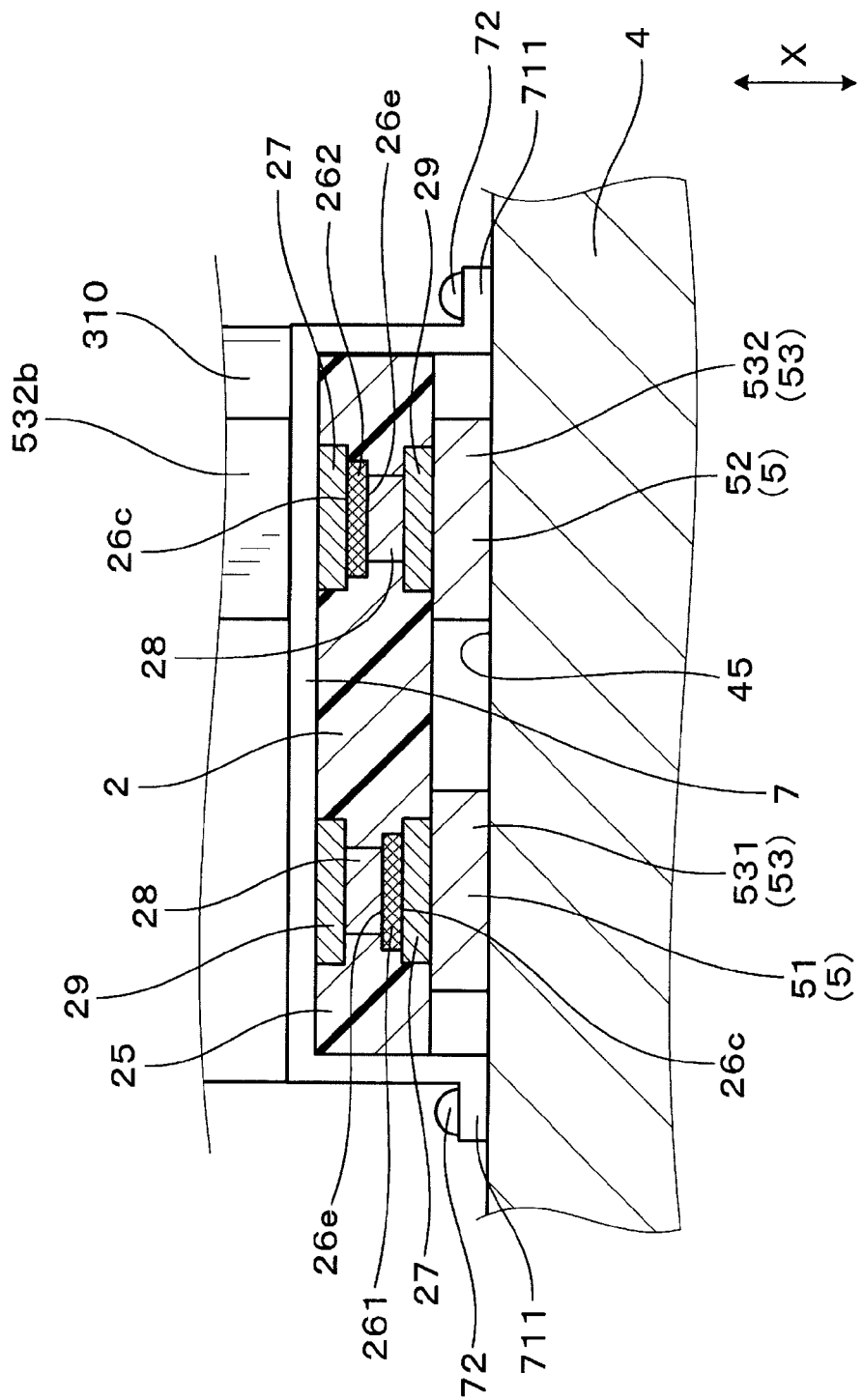
FIG. 16 shows a sectional view taken along a line C-C in FIG. 13.

As shown in FIGS. 13 and 16, the extended portions are provided with terminal pressing members 7 for pressing the extension portions 53 against the cooling member 4 by pressing the semiconductor modules 2 towards the cooling member 4. The terminal pressing members 7 are made of belt-like metal members, for example, and press the semiconductor modules 2 against the cooling member 4 from an opposite side of the cooling member 4. In addition, flange portions 711 formed at both ends of the terminal pressing members 7 are fastened by bolts 72 to the cooling member 4.

Thereby, the semiconductor modules 2 are fixed in a state of being pressed against the cooling member 4 by the terminal pressing members 7. Accordingly, the extended portions 53 interposed between the semiconductor modules 2 and the cooling member 4 are also fixed in a state of being pressed against the cooling member 4. Note that an elastic member may be disposed between the terminal pressing member 7 and the semiconductor module 2.

Amounts of heat of the pair of end-face-electrodes 32 received from the semiconductor modules 2 are different from each other, and the end-face-electrode 32 that receives a large heat amount faces the cooling member 4. The present embodiment shows an example that the amount of heat that the positive end-face-electrode 321 receives from the semiconductor module 2 is larger than the negative-side end-face-electrode 322 does. Therefore, as shown in FIGS. 14 and 15, as described above, the positive-side end-face-electrode 321 of the pair of end-face-electrodes 32 is to face the cooling member 4 in the present embodiment. In the following, a description will be given for what can be a factor that the amount of heat that the positive end-face-electrode 321 receives from the semiconductor module 2 becomes larger than the negative-side end-face-electrode 322 does.

As shown in FIGS. 14 and 15, the length of the positive bus bar 51 is shorter than that of the negative bus bar 52 in the present embodiment. Specifically, the positive electrode bus bar 51 is shorter by the length of the second negative extended portion 532b of the negative electrode bus bar 52. Thus, since the heat transfer distance from the semiconductor module 2 to the positive end-face-electrode 321 is shorter than that of the negative side end-face-electrode 322, the amount of heat that the positive end-face-electrode 321 receives from the semiconductor module 2 is likely to be large.

In addition, as shown in FIG. 16, each of the semiconductor modules 2 in the present embodiment has semiconductor elements 261, 262 inside a mold resin 25. That is, the semiconductor module 2 includes a high-side semiconductor element 261 connected to the positive bus bar 51 and a low-side semiconductor element 262 connected to the negative bus bar 52.

A collector electrode 26c of the high-side semiconductor element 261 is connected to the positive electrode terminal 27 exposed to the cooling member 4, and an emitter electrode 26e of the high-side semiconductor element 261 is connected to an output terminal 29 exposed on the opposite side of the cooling member 4 via a spacer 28.

Further, a collector electrode 26c of the low-side semiconductor element 262 is connected to the positive electrode terminal 27 exposed on the opposite side of the cooling member 4, and the emitter electrode 26e of the low-side semiconductor element 262 is connected to an output terminal 29 exposed to the cooling member 4 via the spacer 28.

Therefore, the heat transfer distance from the high-side of the semiconductor element 261 to the positive electrode bus bar 51 (extended portion 53) is shorter than the heat transfer distance from the low-side semiconductor element 262 to the negative bus bar 52 (extended portion 53). From this point of view, the heat amount that the positive bus bar 51 receives from the semiconductor module 2 is likely to be large.

According to such factors as mentioned above, the positive end-face-electrode 321 to which the positive bus bar 51 is connected receives the heat more easily than the negative end-face-electrode 322 does.

The remainder is the same as in the first embodiment. Note that among the reference numerals used in the present embodiment and the drawings relating to the present embodiment, the same reference numerals as used in the first embodiment represent the same elements as the first embodiment unless otherwise indicated.

Next, functions and effects of the present embodiment will be described.

In the present embodiment, one of the end-face-electrodes 32 that receives the larger amount of the heat from the semiconductor module 2 faces the cooling member 4. Therefore, it is possible to efficiently cool the whole capacitor 3.

In addition, the electric power converter 1 includes the terminal pressing member 7. Thus, by pressing the bus bar 5 connected to the capacitor 3, it is possible to fix the capacitor 3 without directly pressing the capacitor 3. Thus, it is possible to prevent the load from being applied on the capacitor 3 that has relatively weak strength.

The remainder has the same functions and effects as in the first embodiment.

Although an example that the insulating member is disposed between the bus bar and the cooling member is described in the above embodiment, in a case such as the cooling member is molded with a material having no electric conductivity such as a resin, for example, the insulating member may not be used.

Further, although an example that uses a film capacitor as a capacitor in the above embodiment, it is not limited thereto. For example, a multilayer ceramic capacitor may be used. In other words, the capacitor may be any structure including an element body having internal electrodes, and a pair of end-face-electrodes disposed on both end faces of the element body and are connected to the internal electrodes.

Moreover, the cooling member is not limited to one having a coolant passage therein. For example, the cooling member may be constituted by a high thermal conductivity heat sink but does not have a coolant passage therein.

Further, although an example that the capacitor is disposed in a state that the positive end-face-electrode among the pair of end-face-electrodes faces the cooling member is described in the above first and second embodiments, the negative end-face-electrode may be disposed in a state to face the cooling member.

Furthermore, a plurality of embodiments mentioned above may be appropriately combined. For example, the second embodiment may be combined with the fourth embodiment, or the third embodiment may be combined with the fifth embodiment.

What is claimed is:

1. An electric power converter comprising:
   a semiconductor module constituting an electric power conversion circuit;
   a capacitor electrically connected to the semiconductor module; and
   a cooling member for cooling the capacitor, wherein,
   the capacitor includes an element body provided with an internal electrode, and a pair of end-face-electrodes provided on both end faces of the element body and connected to the internal electrode;
   the pair of end-face-electrodes is connected with a pair of bus bars, respectively, in a manner of surface contact,
   the capacitor is disposed in a state where at least one of the pair of end-face-electrodes is facing an insulating member disposed on the cooling member; and
   the end-face-electrode facing the insulating member is in contact with the cooling member via the bus bar and the insulating member,
   wherein the bus bar and the insulating member are sandwiched between the end-face-electrode and the cooling member.

2. The electric power converter according to claim 1, wherein,
   different amounts of heat are received by the pair of end-face-electrodes from the semiconductor module, and an end-face-electrode that receives a larger heat amount faces the cooling member.

3. The electric power converter according to claim 1, wherein,
   one of the end-face-electrodes faces the cooling member, and both of the pair of bus bars connected to the pair of end-face-electrodes are in contact with the cooling member.

4. The electric power converter according to claim 1, wherein,
   the cooling member faces both of the pair of end-face-electrodes, while each of the pair of end-face-electrodes is in contact with the cooling member via the bus bar.

5. The electric power converter according to claim 1, further comprising
   a body pressing member for pressing the capacitor to the cooling member.

6. The electric power converter according to claim 1, wherein,
   the bus bars have extended portions that extend in a direction perpendicular to an aligning direction of the pair of end-face-electrodes;
   the extended portions are interposed between the cooling member and the semiconductor modules; and
   the extended portions are provided with terminal pressing members for pressing the extended portions against the cooling member by pressing the semiconductor modules towards the cooling member.

7. The electric power converter according to claim 1, wherein,
   the entire surfaces of the pair of end-face-electrodes opposite to the element body are connected to the bus bars, respectively.

8. The electric power converter according to claim 1, wherein,
   a dimension of the element body in an aligning direction of the pair of end-face electrodes is smaller than a maximum dimension among external dimensions of the element body in a direction perpendicular to the aligning direction.

* * * * *